(12) United States Patent
Birner et al.

(10) Patent No.: US 9,147,610 B2
(45) Date of Patent: Sep. 29, 2015

(54) MONITOR STRUCTURES AND METHODS OF FORMATION THEREOF

(75) Inventors: Albert Birner, Regensburg (DE); Tobias Herzig, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 13/531,129

(22) Filed: Jun. 22, 2012

(65) Prior Publication Data

US 2013/0341620 A1    Dec. 26, 2013

(51) Int. Cl.
| | |
|---|---|
| H01L 21/00 | (2006.01) |
| H01L 21/768 | (2006.01) |
| H01L 21/66 | (2006.01) |
| H01L 23/48 | (2006.01) |
| H01L 23/31 | (2006.01) |

(52) U.S. Cl.
CPC .......... *H01L 21/76898* (2013.01); *H01L 22/12* (2013.01); *H01L 22/30* (2013.01); *H01L 23/481* (2013.01); *H01L 23/3107* (2013.01); *H01L 2924/0002* (2013.01)

(58) Field of Classification Search
CPC ...................... H01L 21/76229; H01L 21/7684; H01L 21/76898; H01L 23/481; H01L 22/12; H01L 22/30; H01L 2924/0002; H01L 23/3107

USPC .................................................. 438/5, 14, 17
See application file for complete search history.

(56) References Cited

U.S. PATENT DOCUMENTS

| | | |
|---|---|---|
| 4,494,697 A | 1/1985 | Geberth, Jr. |
| 5,702,956 A | 12/1997 | Ying et al. |
| 5,900,644 A | 5/1999 | Ying et al. |
| 6,684,172 B1 * | 1/2004 | Subramanian et al. ........ 702/105 |
| 7,936,052 B2 | 5/2011 | Barth et al. |
| 8,178,953 B2 | 5/2012 | Barth et al. |
| 2003/0057988 A1 | 3/2003 | Maeda et al. |
| 2004/0126986 A1 * | 7/2004 | Wise et al. ..................... 438/424 |
| 2005/0170661 A1 * | 8/2005 | Economikos et al. ......... 438/759 |
| 2012/0231564 A1 | 9/2012 | Lee et al. |

FOREIGN PATENT DOCUMENTS

| | | |
|---|---|---|
| JP | 2003100832 A | 4/2003 |
| JP | 2012064847 A | 3/2012 |
| KR | 1020120103025 A | 9/2012 |

* cited by examiner

*Primary Examiner* — Laura Menz
(74) *Attorney, Agent, or Firm* — Slater & Matsil, L.L.P.

(57) ABSTRACT

In accordance with an embodiment of the present invention, a method of forming an electronic device includes forming a first opening and a second opening in a workpiece. The first opening is deeper than the second opening. The method further includes forming a fill material within the first opening to form part of a through via and forming the fill material within the second opening.

15 Claims, 11 Drawing Sheets

MONITOR STRUCTURES AND METHODS OF FORMATION THEREOF

TECHNICAL FIELD

The present invention relates generally to electronic devices, and more particularly to monitor structures and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of materials over the semiconductor wafers, patterning the thin films of material, doping selective regions of the semiconductor wafers, and other processes.

In a conventional semiconductor fabrication process, a large number of semiconductor devices are fabricated within and/or over a single wafer. A semiconductor device may comprise one or more through silicon vias for information or power routing through a silicon chip and for connecting to the chip backside. In particular, silicon interposers having frontside and backside metallization layers exhibiting tailored through contacts fabricated by through silicon vias. Each of the semiconductor devices may comprise a plurality of through vias. Similarly, semiconductor packages comprising these semiconductor devices may also include a plurality of through vias.

However, forming through vias introduces various process complexities, which can result in significant yield loss.

SUMMARY OF THE INVENTION

These and other problems are generally solved or circumvented, and technical advantages are generally achieved, by illustrative embodiments of the present invention.

In accordance with an embodiment of the present invention, a method of forming an electronic device comprises forming a first opening and a second opening in a workpiece. The first opening is deeper than the second opening. The method further comprises forming a fill material within the first opening to form part of a through via and forming the fill material within the second opening.

In accordance with an embodiment of the present invention, a method of forming a semiconductor device comprises forming a first opening for a through via in a first workpiece and a second opening for a monitor structure. The first opening is deeper than the second opening. The method further comprises depositing a fill material within the second opening up to a fill depth and using a measurement of the fill depth within the second opening, and depositing the fill material within the first opening.

In accordance with an embodiment of the present invention, an electronic device comprises a functional conductive structure disposed in a work piece and a non-functional monitor structure disposed in the workpiece. The monitor structure is configured for use in monitoring the fabrication of the functional conductive structure.

In accordance with an embodiment of the present invention, a device comprises an electronic chip, an encapsulant proximate the electronic chip, and a conductive structure disposed in the encapsulant. The conductive structure is not coupled to the electronic chip. The encapsulant has about a same thickness as the electronic chip.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1B, illustrates a semiconductor device in accordance with an embodiment of the invention, wherein FIG. 1A illustrates a top sectional view and wherein FIG. 1B illustrates a cross-sectional view;

FIG. 2, which includes FIGS. 2A-2C, illustrates an alternative semiconductor device in accordance with an embodiment of the invention, wherein FIG. 2A illustrates a top sectional view and wherein FIGS. 2B and 2C illustrate a cross-sectional view;

FIG. 3, which includes FIGS. 3A-3C, illustrates an alternative semiconductor device in accordance with an embodiment of the invention, wherein FIG. 3A illustrates a top sectional view and wherein FIG. 3B and FIG. 3C illustrate a cross-sectional view;

FIG. 5, which includes FIGS. 5A and 5B, illustrates a semiconductor package in accordance with an embodiment of the invention, wherein FIG. 5A illustrates a top sectional view and wherein FIG. 5B illustrates a cross-sectional view;

FIG. 6, which includes

FIG. 7, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of a semiconductor device will be described using FIG. 1. Further structural embodiments of the semiconductor device will be described using FIGS. 2-6. Various methods of fabricating the semiconductor device will be described using FIGS. 7 and 8.

Figure 1A:
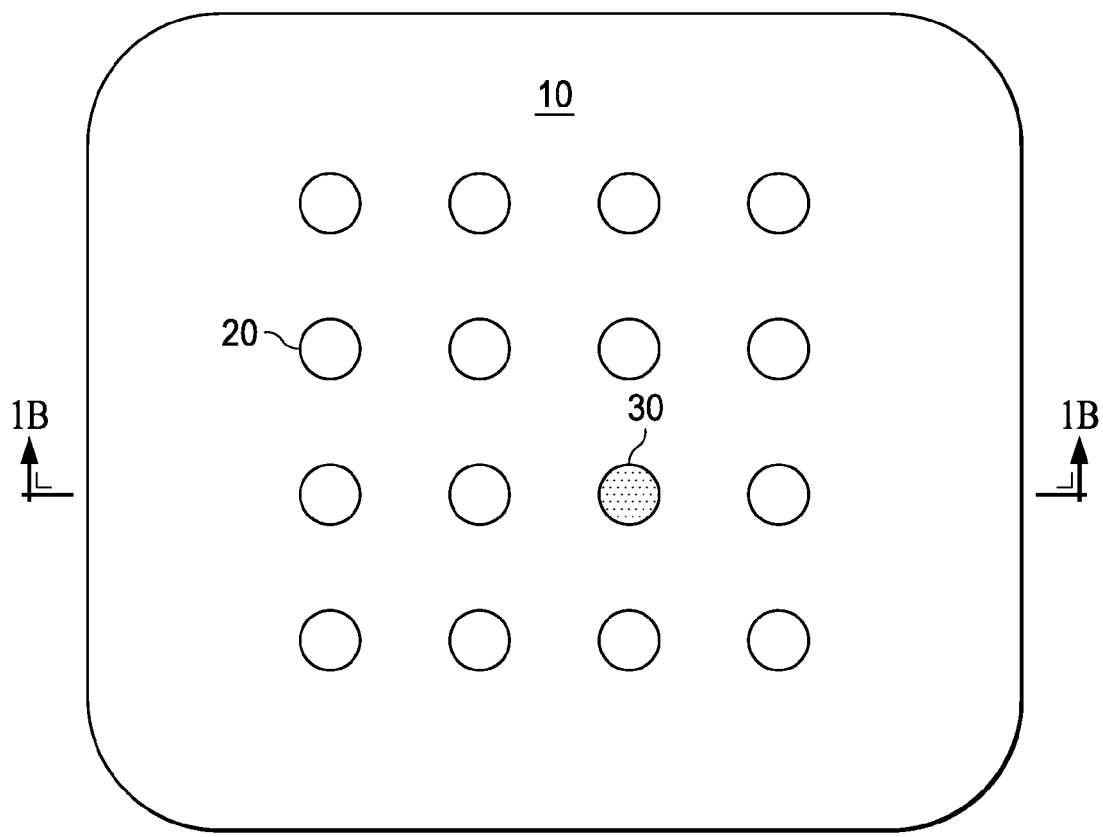
Figure 1B:
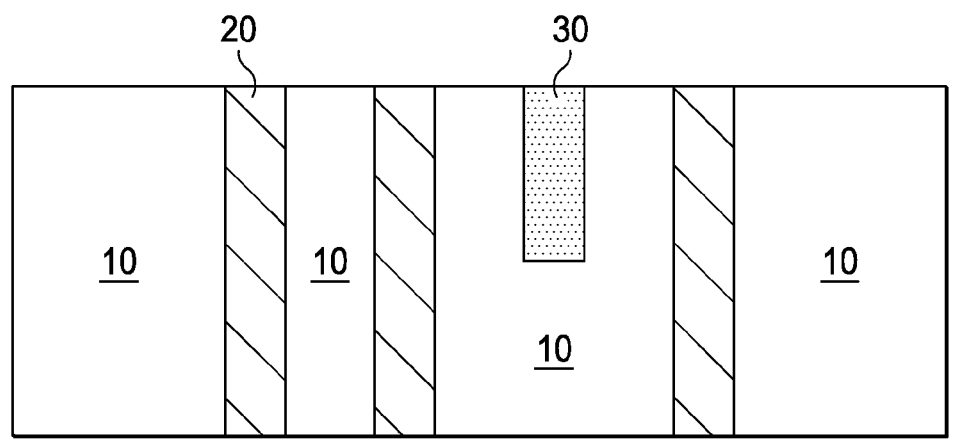

FIG. 1, which includes FIGS. 1A-1B, illustrates a semiconductor device in accordance with an embodiment of the invention, wherein FIG. 1A illustrates a top sectional view and wherein FIG. 1B illustrates a cross-sectional view.

Referring to FIG. 1A, a semiconductor device comprises an electronic chip 10. In various embodiments, the electronic chip 10 may comprise any suitable substrate material. In one or more embodiments, the electronic chip 10 may comprise a silicon substrate. In alternative embodiments, the electronic chip 10 may comprise a semiconductor on insulator substrate. In a further alternative embodiment, the electronic chip 10 may comprise other semiconductor substrates such as silicon carbon, silicon germanium, gallium nitride, InSb, InP, gallium arsenide, and others.

In various embodiments, the electronic chip 10 may comprise a semiconductor chip. The electronic chip 10 may also comprise any other type of chips, for example, plastic, organic devices, and others. In various embodiments, the electronic chip 10 may comprise functional circuitry and may comprise integrated circuits. The electronic chip 10 may comprise a logic chip, a memory chip, an analog chip, a mixed signal chip, power devices, and other types of circuitry. In one or more embodiments, the electronic chip 10 may comprise a plurality of devices such as a plurality of transistors including field effect transistors, bipolar transistors, IGBTs, JFETs, diodes, and others.

In various embodiments, the electronic chip 10 comprises a plurality of through vias 20. As illustrated in FIG. 1B, the plurality of through vias 20 extend through the electronic chip 10. The plurality of through vias 20 may comprise a conductive material in various embodiments. The plurality of through vias 20 may couple a back surface of the electronic chip 10 to a front surface of the electronic chip 10 in one or more embodiments. Alternatively, in some embodiments, the plurality of through vias 20 may be used to couple adjacent (stacked) semiconductor devices.

As further illustrated in FIG. 1A, the electronic chip 10 comprises a monitor structure 30. In various embodiments, the monitor structure 30 may comprise a conductive material similar to the plurality of through vias 20. In one or more embodiments, the monitor structure 30 comprises a partial via which extends from one surface of the substrate but without extending to the other surface.

As illustrated in FIG. 1B, the monitor structure 30 has a depth less than the thickness of the electronic chip 10. In one or more embodiments, the monitor structure 30 is used as a structure to monitor the formation of the plurality of through vias 20 during fabrication. As will be described in further detail below, the monitor structure 30 is used to ensure that the fill height of the plurality of through vias 20 matches the process parametrics.

In one or more embodiments, the number of monitor structure 30 relative to the number of through vias 20 may be quite less. In one or more embodiments, a single monitor structure 30 may be used to monitor at least ten through vias 20. In a further embodiment, at least fifty through vias 20 may have a single monitor structure 30. In yet another embodiment, at least hundred through vias 20 may have a common monitor structure 30.

As a further example, the electronic chip 10 may comprise about 1 to about 100,000 through vias 20 and about 1 to about 5000 monitor structures 30 in various embodiments. In various embodiments, the ratio of the number of monitor structures 30 to the number of through vias 20 may vary from about 1:1 to about 1:100,000.

Thus, in various embodiments, the number of monitor structure 30 needed to monitor a large number of through vias 20 is quite minimal. Advantageously, the monitor structures 30 take up minimal area on the semiconductor device.

In one or more embodiments, the monitor structure 30 may be coupled to a ground potential node. In alternative embodiments, the monitor structure 30 may not be coupled to the functional circuitry disposed in the electronic chip 10. In some embodiments the monitor structure 30 may be floating.

Figure 2A:
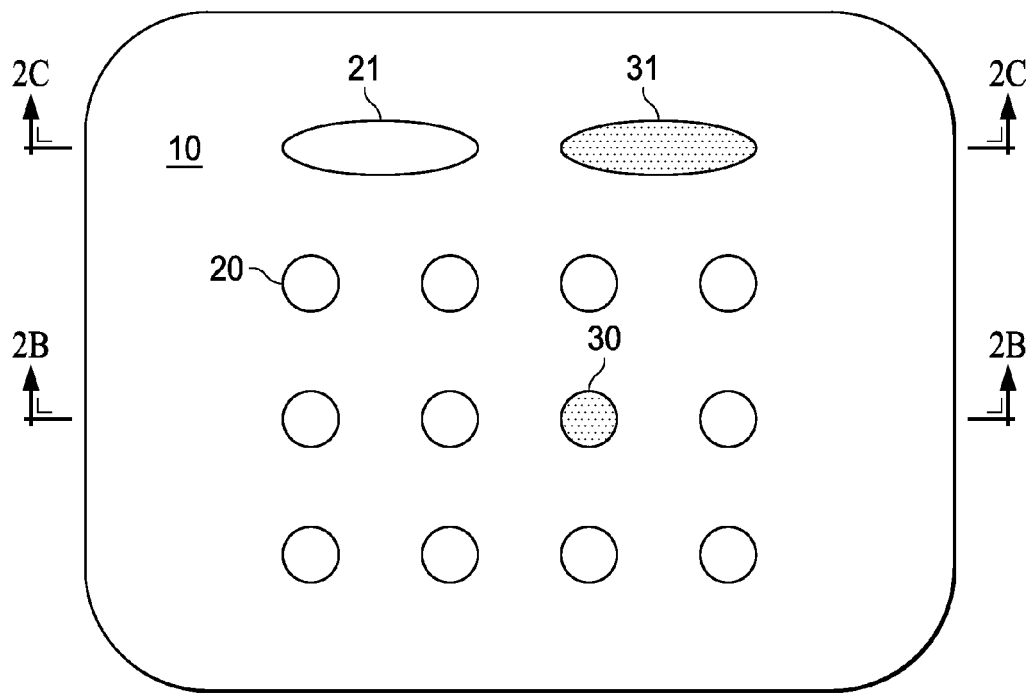
Figure 2B:
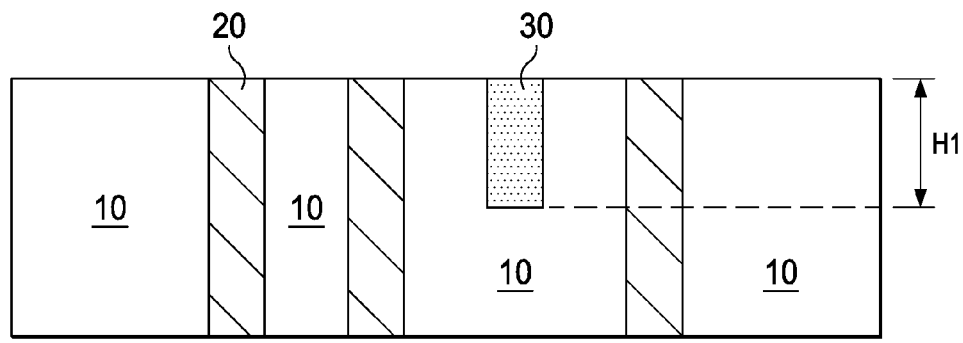
Figure 2C:
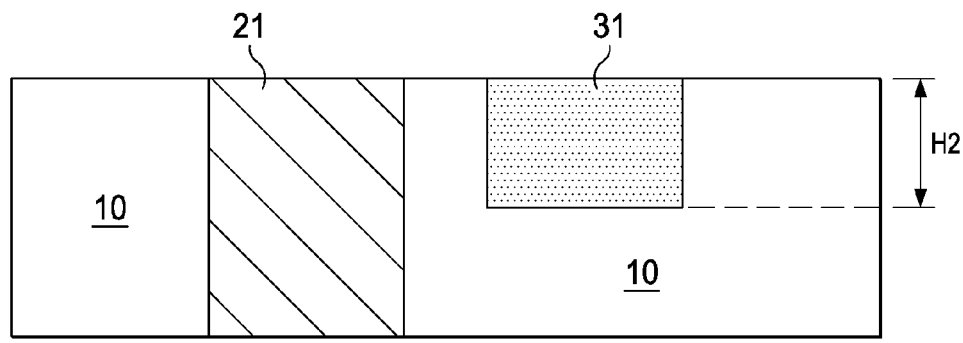

FIG. 2, which includes FIGS. 2A-2C, illustrates an alternative semiconductor device in accordance with an embodiment of the invention, wherein FIG. 2A illustrates a top sectional view and wherein FIGS. 2B and 2C illustrate a cross-sectional view.

In various embodiments, the monitor structure may have different shapes and sizes. In one or more embodiments, the shape and size of the monitor structure may depend on the shape and size of the through substrate via being formed. As illustrated in FIG. 2A, in one embodiment, the electronic chip 10 may comprise a plurality of through vias 20 and a corresponding monitor structure 30. Further, the electronic chip 10 may comprise a second through substrate via 21 and a corresponding second monitor structure 31. The second monitor structure 31 may have a different height or different width (critical dimension) than the monitor structure 30. This is illustrated in FIGS. 2B and 2C. FIG. 2B illustrates the monitor structure 30 having a first height H1 while FIG. 2C illustrates the second monitor structure 31 having a second height H2.

Figure 3A:
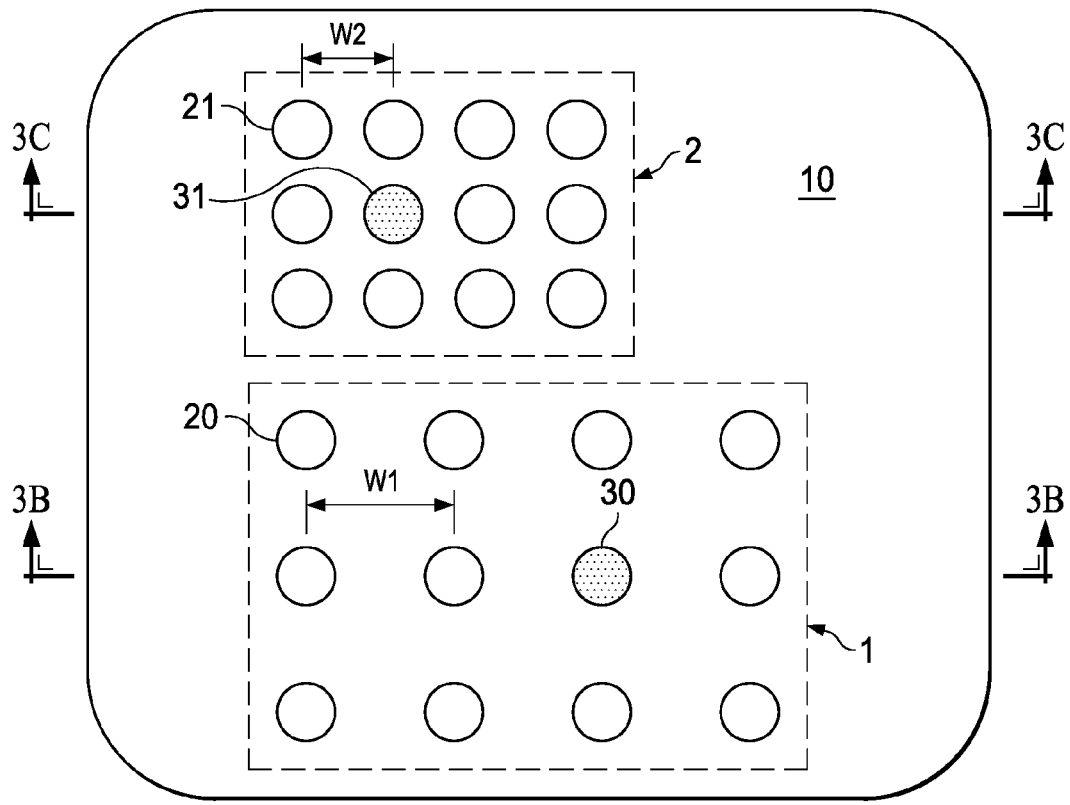
Figure 3B:
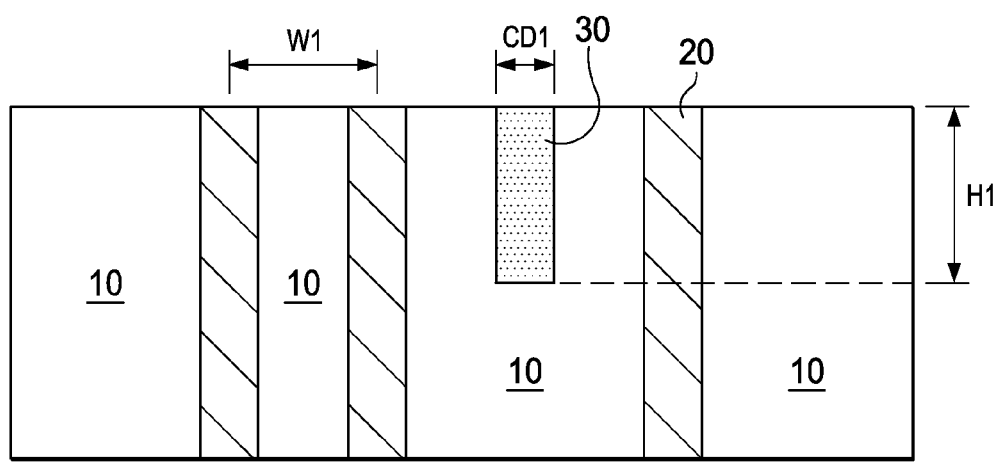
Figure 3C:
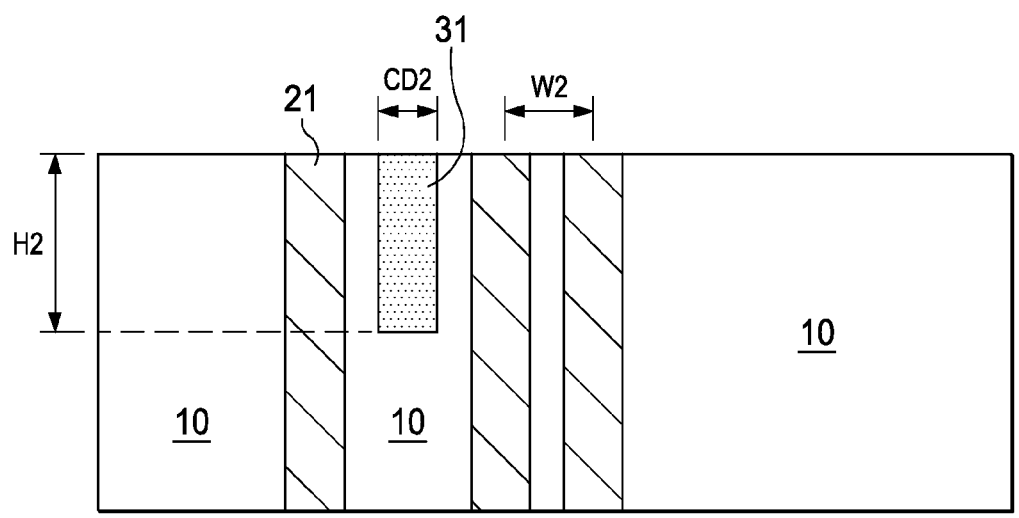

FIG. 3, which includes FIGS. 3A-3C, illustrates an alternative semiconductor device in accordance with an embodiment of the invention, wherein FIG. 3A illustrates a top sectional view and wherein FIG. 3B and FIG. 3C illustrate a cross-sectional view.

FIG. 3 illustrates an alternative embodiment in which the shape and size of the monitor structure depends on the density of the through substrate vias. Referring to FIG. 3A, the electronic chip 10 may comprise a first region 1 and a second region 2. However, the density of the through vias in the first region 1 is different from the density of the through vias in the second region 2. For example, the first region 1 may comprise a first set of through vias 20 having a first pitch W1 while the second region 2 may comprise a second set of through substrate vias 21 having a second pitch W2. As illustrated, the first pitch W1 is different from the second pitch W2. In one case, the second pitch W2 is smaller than the first pitch W1.

The monitor structures in the first region 1 may be different from the monitor structures in the second region 2. As illustrated in FIG. 3B, the monitor structure 30 may have a first critical dimension CD1 while the second monitor structure 31 may have a second critical dimension CD2. In various embodiments, the first critical dimension CD1 may be different than the second critical dimension CD2. In one embodiment, the second critical dimension CD2 is smaller than the first critical dimension CD1 due to the higher density of through substrate vias in the second region 2.

Similarly, the monitor structure 30 may have a first height H1 that is different from the second height H2 of the second monitor structure 31. In one embodiment, the second height H2 is less than the first height H1 due to the higher density of through substrate vias in the second region 2.

Accordingly, in various embodiments, the shape and size of the monitor structures may be varied depending on the shape, size, and density of the through substrate vias that are being monitored during fabrication.

Figure 4:
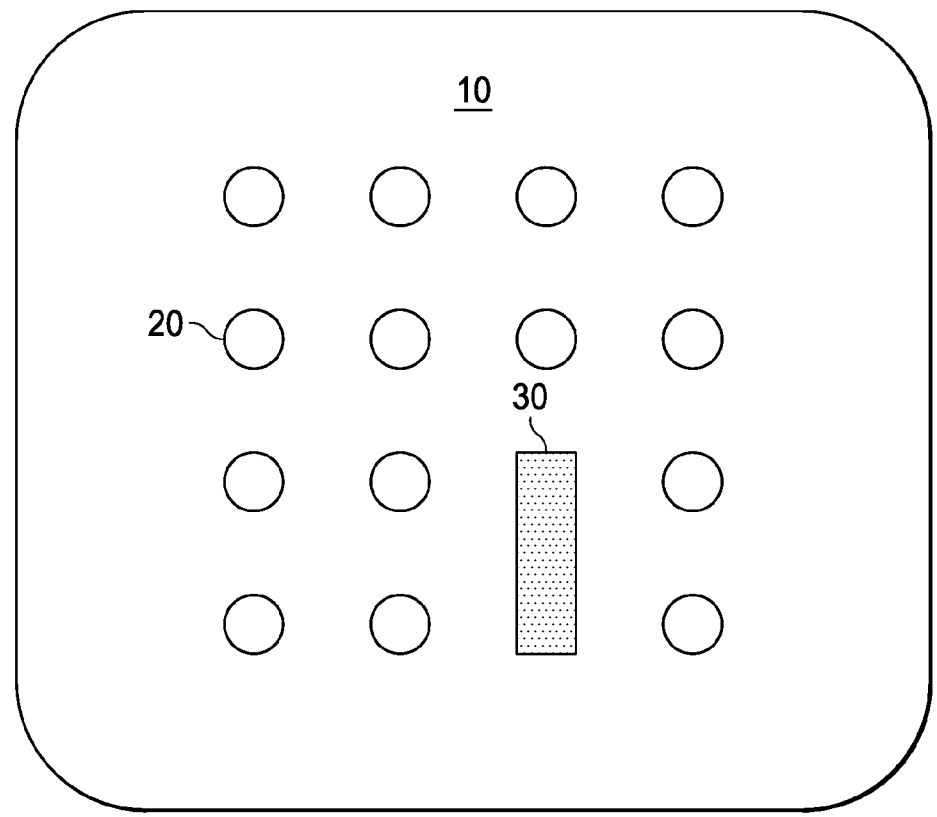
FIG. 4 illustrates a top cross-sectional view of a semiconductor device according to an embodiment of the invention.

FIG. 4 illustrates a top cross-sectional view of a semiconductor device according to an embodiment of the invention.

In various embodiments, the shape of the monitor structures may be different from the shape of the through vias 20. Referring to FIG. 4, the monitor structure 30 may be formed as a trench in one or more embodiments even though the through substrate vias 20 comprise a certain circular or elliptical shape. In other alternate embodiments, the monitor structure 30 may have other shapes such as trapezoidal, hexagonal, octagonal, T-shape, H-shape, and others.

Figure 5A:
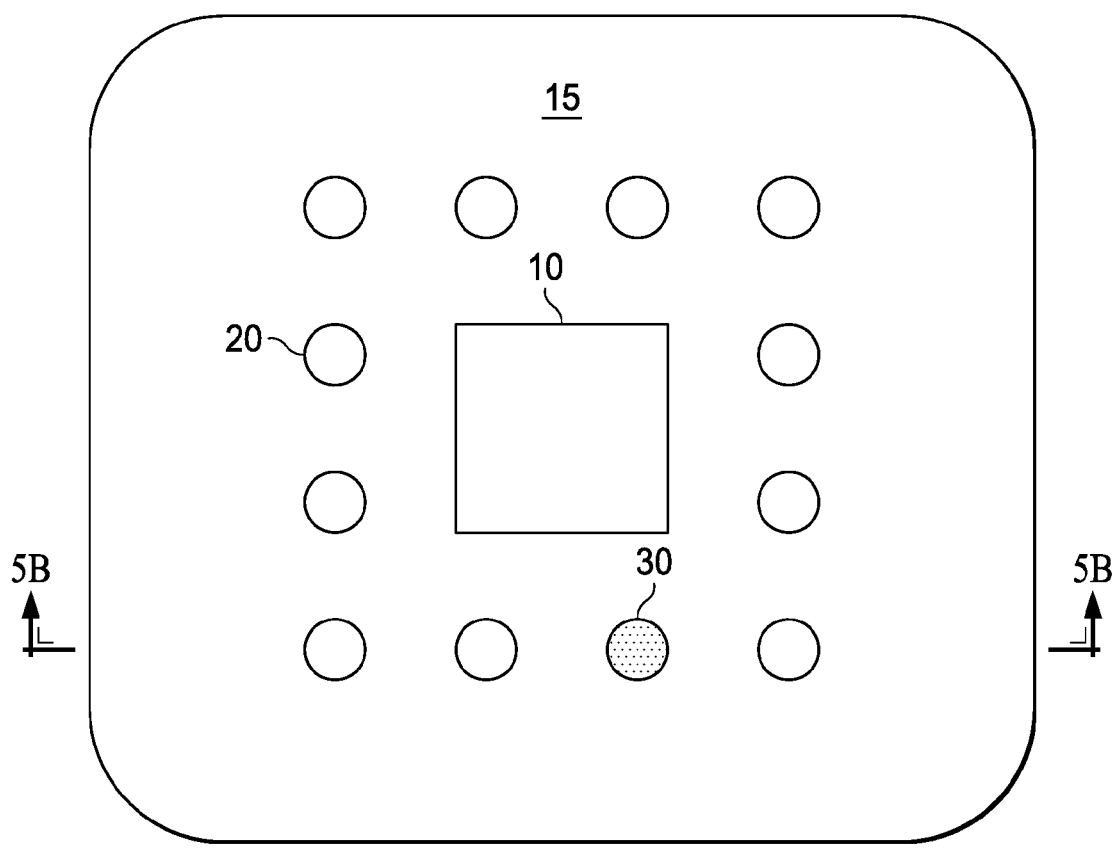
Figure 5B:
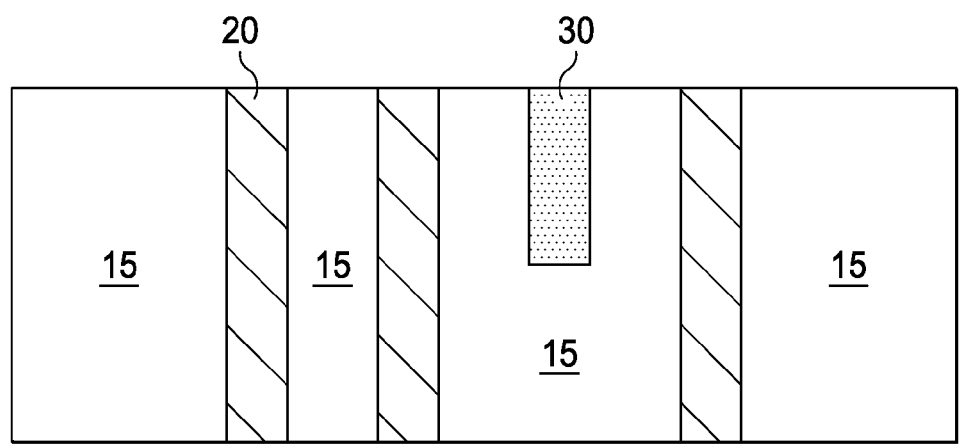

FIG. 5, which includes FIGS. 5A and 5B, illustrates a semiconductor package in accordance with an embodiment of the invention, wherein FIG. 5A illustrates a top sectional view and wherein FIG. 5B illustrates a cross-sectional view.

Embodiments of the invention also include through vias formed in semiconductor packages, for example, in an embedded wafer level process. Referring to FIG. 5A, the semiconductor package includes the electronic chip 10 disposed within. The electronic chip 10 may be any type of semiconductor component in various embodiments. In one or more embodiments, the electronic chip 10 may be a logic chip, an analog chip, a mixed signal chip, a memory chip, and/or a discrete component.

In various embodiments, the electronic chip 10 may be packaged using any type of packaging technology. A plurality of through vias 20 are disposed adjacent the electronic chip 10 within an encapsulant 15. The encapsulant 15 provides mechanical support and hermetic sealing to the electronic chip 10. In various embodiments, the encapsulant 15 may have about the same thickness as the electronic chip 10. For example, a dielectric layer may be disposed above the encapsulant 15 and the electronic chip 10 and may comprise redistribution lines and may be used to couple to contacts.

As illustrated in FIG. 5A, a monitor structure 30 is disposed within the encapsulant 15. As further illustrated in FIG. 5B, the monitor structure 30 does not extend completely through the encapsulant 15 and is therefore not a functional through package via. The monitor structure 30 may be designed similar to the monitor structures as described in prior embodiments. In various embodiments, the monitor structure 30 may not be connected to any other component. In other words the monitor structure 30 may not be coupled to the electronic chip 10 and may serve no other purpose besides being used as a monitor during the fabrication of the through vias 20.

In one or more embodiments, the number of monitor structure 30 to the number of through vias 20 may be quite less. In one or more embodiments, at least ten through vias 20 may use a single monitor structure 30. In a further embodiment, at least fifty through vias 20 may have a single monitor structure 30. In yet another embodiment, at least hundred through vias 20 may have a common monitor structure 30. Thus, in various embodiments, the number of monitor structure 30 needed to monitor a large number of through vias 20 is quite minimal. Advantageously, the monitor structures 30 require minimal area on the semiconductor package.

In one or more embodiments, the monitor structure 30 may not be coupled to any functional circuitry on the electronic chip 10. In some embodiments, the monitor structure 30 may be coupled to a ground potential node. In further embodiments, the monitor structure 30 may be floating.

Figure 6A:
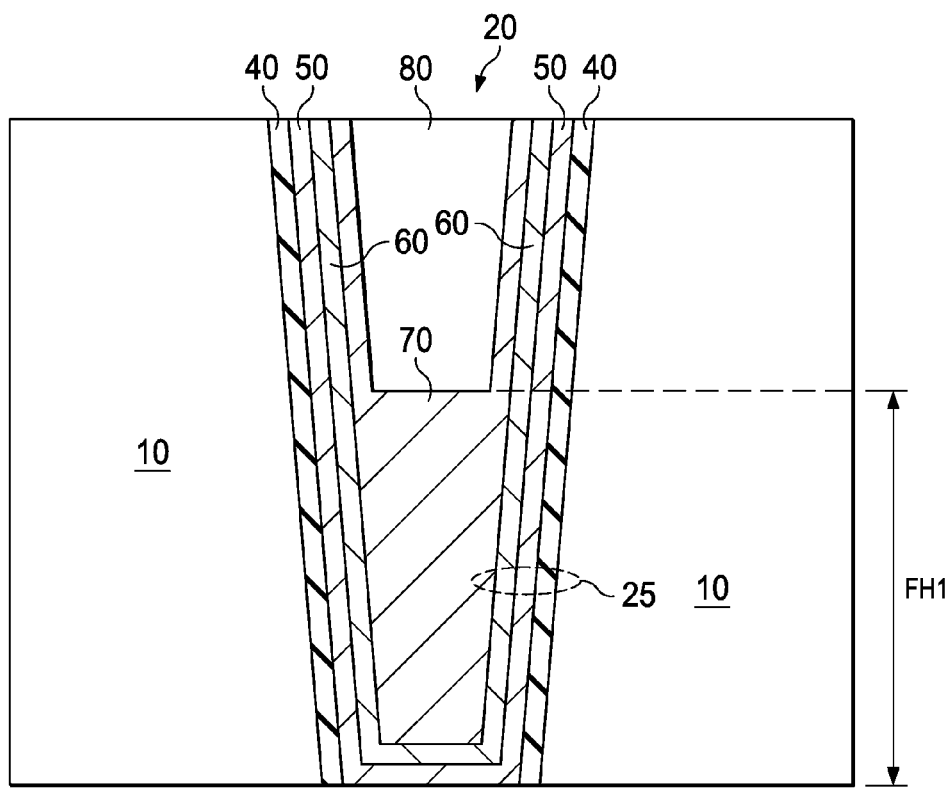
FIGS. 6A and 6B, illustrates a magnified cross-sectional of a through via and the monitor structure in accordance with embodiments of the invention.
Figure 6B:
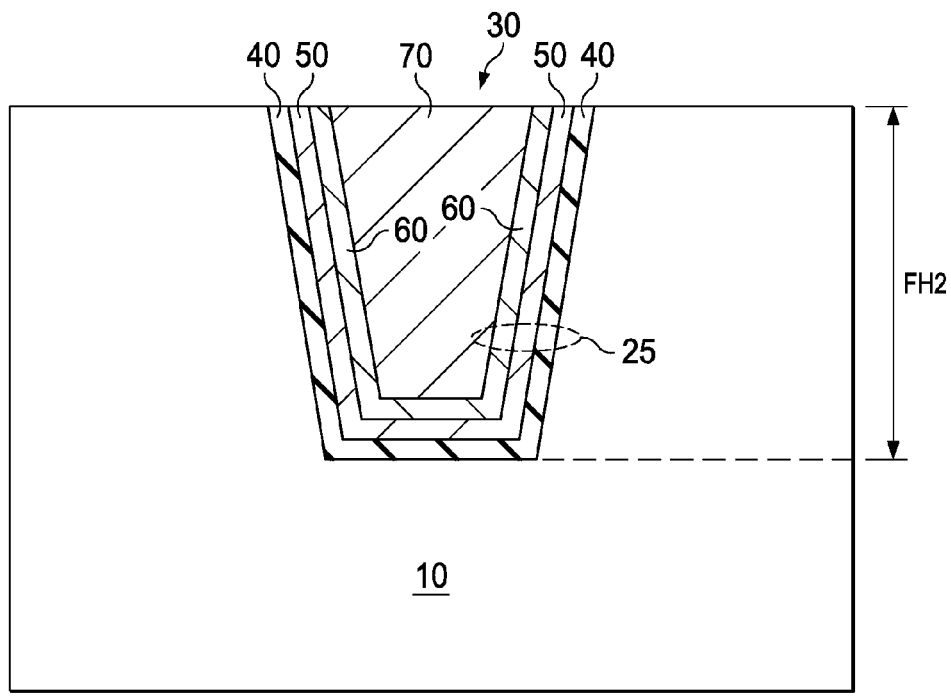

FIG. 6, which includes FIGS. 6A and 6B, illustrates a magnified cross-sectional of a through via and the monitor structure in accordance with embodiments of the invention.

Referring to FIG. 6A, a through via 20 is disposed within a electronic chip 10 (alternatively within an encapsulant in case of a semiconductor package). The through via 20 comprises a liner 25 and the fill material 70 in various embodiments. The liner 25 may comprise a plurality of layers in various embodiments. In one or more embodiments, the liner 25 may comprise a dielectric liner 40, a metal liner 50, and the seed layer 60.

As illustrated in FIG. 6A, the through vias 20 may be isolated from the electronic chip 10 by a dielectric liner 40. The dielectric liner 40 is formed as a spacer on the sidewalls of the opening forming the through via 20. In various embodiments, the dielectric liner 40 may be an oxide, nitride, oxynitride, or a low-k dielectric material layer. In some embodiments, the dielectric liner 40 may comprise a high-k dielectric material. The dielectric liner 40 is optional and may not be used in some embodiments.

A metal liner 50 is disposed over the dielectric liner 40 in various embodiments. The metal liner 50 acts as a metal diffusion barrier in some embodiments. In one embodiment, the metal liner 50 comprises Ta, TaN, TiW, Ti, TiN, Ru, W, WN, WCN, or a combination thereof.

In various embodiments, the metal liner 50 may have a thickness of about 20 nm to about 200 nm. In one or more embodiments, the metal liner 50 may have a thickness of about 50 nm to about 150 nm. In one or more embodiments, the metal liner 50 may have a thickness of about 100 nm to about 200 nm. In one or more embodiments, the metal liner 50 may have a thickness of about 100 nm.

An optional seed layer 60 is disposed over the metal liner 50. The seed layer 60 may be used as a seed for the deposition of the subsequent fill material. The seed layer 60 may comprise copper in one embodiment. The seed layer 60 may have a thickness of about 30 nm to about 3000 nm in various embodiments. The seed layer 60 may have a thickness of about 30 nm to about 300 nm in or more embodiments. In one or more embodiments, the seed layer 60 may have a thickness of about 200 nm to about 400 nm. In one or more embodiments, the seed layer 60 may have a thickness of about 250 nm to about 350 nm. In one or more embodiments, the seed layer 60 may have a thickness of about 300 nm.

A fill material 70 is disposed over the metal liner 50 in various embodiments. In one or more embodiments, the fill material 70 is disposed over the seed layer 60. In one or more embodiments, the fill material 70 may comprise copper. In alternative embodiments the fill material 70 may comprise aluminum, titanium, tantalum, silver, gold, nickel, palladium, zinc, cobalt, doped polysilicon, titanium nitride, tantalum nitride, tungsten nitride silicides, and others.

As illustrated in FIG. 6A, the fill material 70 may fill up to a thickness of a first fill height FH1. A ratio of the first fill height FH1 to the total thickness of the electronic chip 10 may be about 1:2 to about 1:10 in various embodiments.

As further illustrated in FIG. 6A, in various embodiments, a void 80 may be disposed within the through via 20. In one or more embodiments, the void 80 may be sealed by subsequent dielectric layers formed over the substrate of the electronic chip 10. Alternatively, in some embodiments, the void 80 may comprise dielectric materials deposited subsequently.

FIG. 6B illustrates a magnified cross-sectional view of the monitor structure 30 in accordance with embodiments of the invention.

As illustrated in FIG. 6B, the monitor structure 30 may comprise a liner 25 similar to the liner 25 of the through via 20 as described in FIG. 6A. As described above, the liner 25 may comprise a dielectric liner 40, a metal liner 50, and a seed layer 60.

Unlike the through via 20 illustrated in FIG. 6A, the monitor structure 30 extends partially into the substrate of the electronic chip 10. Further, the fill material 70 more or less fills the opening of the monitor structure 30. In one embodiment, a top surface of the fill material 70 is coplanar with the top surface of the substrate of the electronic chip 10. However, in alternative embodiments, the top surface of the fill material 70 may be above or below the top surface of the substrate of the electronic chip 10.

The second fill height FH2 of the fill material 70 in the monitor structure 30 may be about the same as the first fill height FH1 of the fill material 70 in the through via 20 in one or more embodiments. In alternative embodiments, the second fill height FH2 of the fill material 70 in the monitor structure 30 may be different from the first fill height FH1 of the fill material 70 in the through via 20.

In various embodiments, a ratio of the second fill height FH2 of the fill material 70 in the monitor structure 30 to the first fill height FH1 of the fill material 70 in the through via 20 may be about 1:2 to about 2:1. In various embodiments, a ratio of the second fill height FH2 of the fill material 70 in the monitor structure 30 to the first fill height FH1 of the fill material 70 in the through via 20 may be about 1:1.5 to about 1.5:1. In various embodiments, a ratio of the second fill height FH2 of the fill material 70 in the monitor structure 30 to the first fill height FH1 of the fill material 70 in through via 20 may be about 1:1.2 to about 1.2:1.

Embodiments of the invention may be applied to any structure not just to through vias. For example, any structure with the high aspect ratio (e.g., greater than about 10:1) and which is partially filled may benefit from the use of monitor structures described above using FIGS. 1-6. In various embodiments, examples of such structures may include buried bit lines, buried word line, trench capacitors, deep trench structures, and others.

FIG. 7, which includes FIGS. 7A-7I, illustrates a semiconductor device during various stages of fabrication in accordance with embodiments of the invention. FIG. 8 illustrates operations during part of the process flow fabrication in accordance with embodiments of the invention.

Figure 7A:
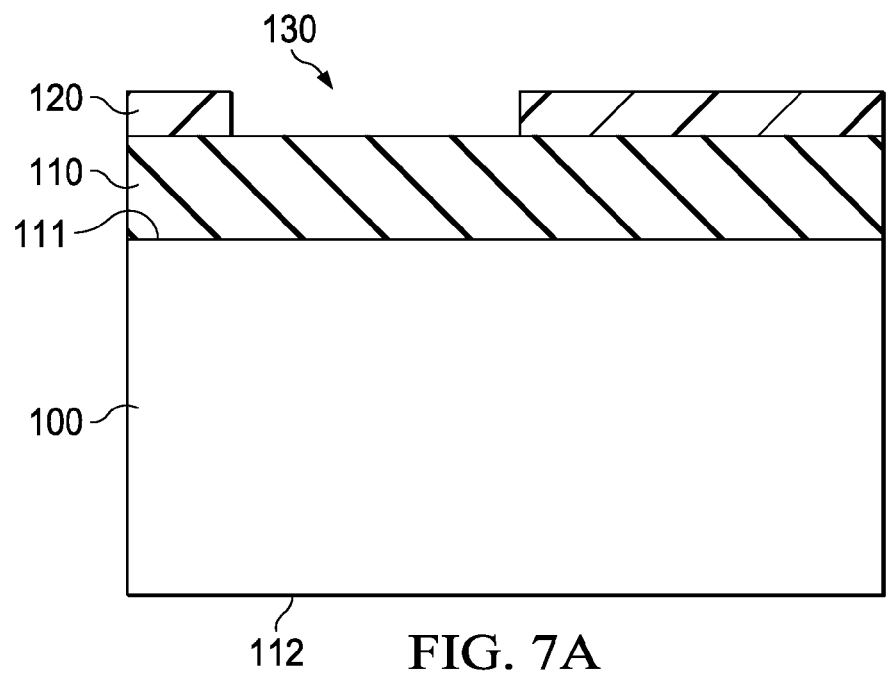
FIGS. 7A-7I, illustrates a semiconductor device during various stages of fabrication in accordance with embodiments of the invention.
Figure 8:
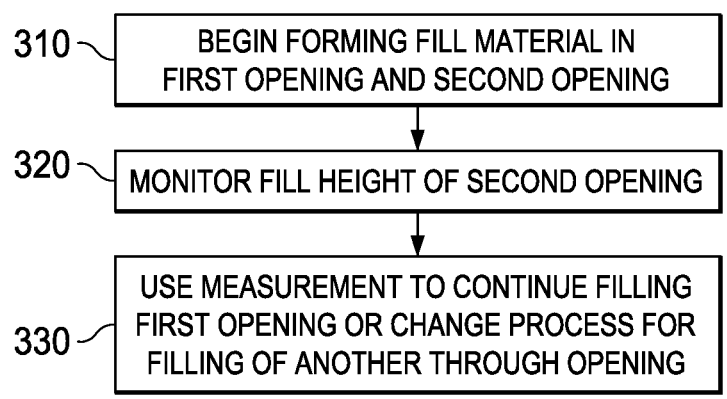
FIG. 8 illustrates operations during part of the process flow in accordance with embodiments of the invention.

FIG. 7A illustrates a substrate 100 having a plurality of dies after all front end and back end processing. Front end processing refers to the formation of active device regions while back end processing refers to the formation of metallization layers to interconnect the various devices of the integrated circuit. In other words, the substrate 100 may be a processed wafer having a plurality of dies including metallization formed therein. For example, in one or more embodiments, the substrate 100 comprises a wafer having an array of dies on a front side.

In various embodiments, the substrate 100 may be silicon alloys and compound semiconductors. The substrate 100 may be a wafer and may include epitaxial layers in various embodiments. In one or more embodiments, the substrate 100 may be a bulk silicon wafer or a silicon-on-insulator wafer. In some embodiments, the substrate 100 may be an III-V substrate with elements from Group III and Group V, or the substrate 100 may be an II-VI substrate with elements from Group II and Group VI. In one or more embodiments, the substrate 100 may be a silicon-on-sapphire (SOS) substrate. In one or more embodiments, the substrate 100 may be a germanium-on-insulator (GeOI) substrate. In one or more embodiments, the substrate 100 may include one or more semiconductor materials such as silicon, silicon germanium, silicon carbon, germanium, gallium arsenide, indium arsenide, indium arsenide, gallium nitride, indium gallium arsenide, or indium antimonide.

The plurality of dies may comprise different type of dies including integrated circuits or discrete devices. In one or more embodiments, the plurality of dies in the substrate 100 may comprise logic chips, memory chips, analog chips, mixed signal chips, and combinations thereof such as system on chip. The plurality of dies may comprise various types of active and passive devices such as diodes, transistors, thyristors, capacitors, inductors, resistors, optoelectronic devices, sensors, microelectromechanical systems, and others. In one alternative embodiment, the substrate 100 comprises a plurality of dies, each die being a discrete device such as a single transistor. Examples of discrete devices include power devices, vertical devices (current flowing from top to bottom), and others.

In various embodiments, active regions on circuitry connecting the active regions may be disposed proximate first side 111 or proximate a second side 112.

In various embodiments, the substrate 100 may be a reconstituted wafer, for example, comprising a plurality of dies disposed in an encapsulant. Thus, the embodiments described with respect to FIG. 7 will be used to form the semiconductor devices/semiconductor packages illustrated in FIGS. 1-6.

A first dielectric layer 110 is disposed over the substrate 100. In various embodiments, the first dielectric layer 110 may comprise $SiO_2$, tetra ethyl oxysilane (TEOS), fluorinated TEOS (FTEOS), doped glass (borophosphosilicate glass (BPSG), phosphosilicate glass (PSG), borosilicate glass (BSG)), organo silicate glass (OSG), fluorinated silicate glass (FSG), spin-on glass (SOG), SiN, SiON, or low-k insulating materials such as SiCOH.

The first insulating layer 110 may comprise a thickness of about 5000 nm or less in various embodiments. In one embodiment, the first insulating layer 110 comprises a thickness of about 50 nm to about 500 nm. In another embodiment, the first insulating layer 110 comprises a thickness of about 100 nm to about 1000 nm. In another embodiment, the first insulating layer 110 comprises a thickness of about 500 nm to about 2000 nm. In one embodiment, the first insulating layer 110 comprises a thickness of about 1000 nm to about 3000 nm. In one embodiment, the first insulating layer 110 comprises a thickness of about 2000 nm.

Referring again to FIG. 7A, a first resist layer 120 is deposited and patterned thereby forming a first opening 130. The pattern for the first opening 130 comprises a wider section of the through substrate via that is being formed.

In various embodiments, the first resist layer 120 may comprise a single resist layer, or a multi-layer resist such as a bi-layer resist layer or a tri-layer resist. As an example, a tri-layer resist stack may comprise three layers: a thick bottom resist layer over the first insulating layer 110, a middle resist layer over the bottom resist layer, and a top resist layer on top of the middle resist layer. For example, the top resist layer may be a patternable resist. The middle resist layer may, for example, be a material such as an anti-reflective coating (ARC) with high silicon content (Si BARC Si content >30 wt %). The Si BARC material typically comprises a $SiO_xC_y(N_y)$ type compound, although other suitable anti-reflective material may be used in case certain etch selectivity requirements are met. The ARC is used to block reflected radiation from the underlying layers. The reflected radiation from these underlying layers may result in additional interference patterns and result in line width variations in the top resist layer exposed to radiation. The bottom resist layer may be a hard baked organic dielectric layer (ODL). The top resist layer functions as mask for etching the middle resist layer which functions, besides its role as reflection suppressant, as the masking material for etching the comparatively thicker bottom resist layer. A top ARC layer is formed over the top layer. The formation of the resist layer may include bakes or anneals after deposition of each layer.

Figure 7B:
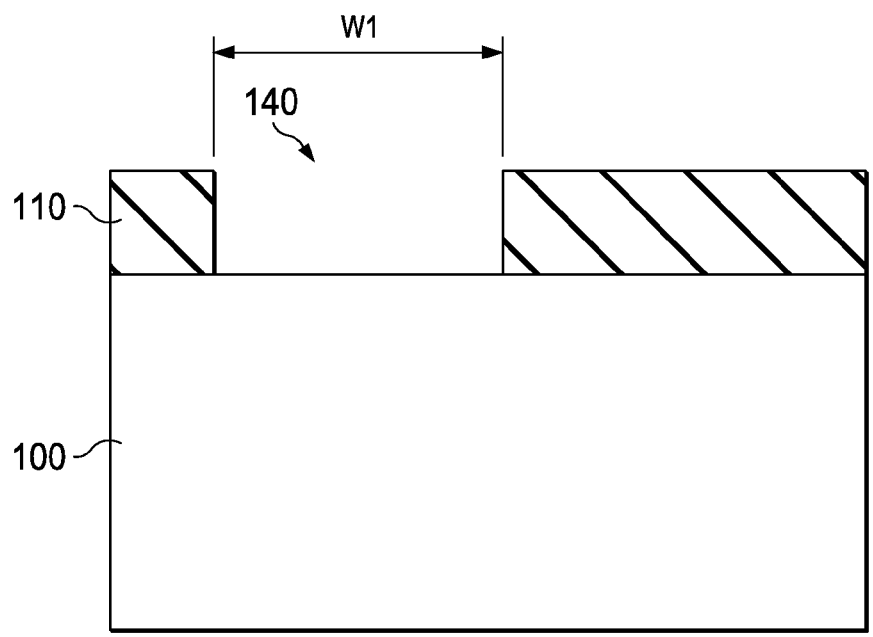

As next illustrated in FIG. 7B, the first insulating layer 110 is patterned using the first resist layer 120. After patterning the first insulating layer 110, any remaining first resist layer 120 may be removed, for example, using an etching process. Thereby a second opening 140 is formed in the first insulating layer 110. The second opening 140 may have a first critical dimension W1 as illustrated in FIG. 7B. In various embodiments, the first critical dimension W1 may be about 10 µm to about 50 µm. In one or more embodiments, the first critical dimension W1 may be about 10 µam to about 30 µm. In one embodiment, the first critical dimension W1 may be about 10 µm.

Figure 7C:
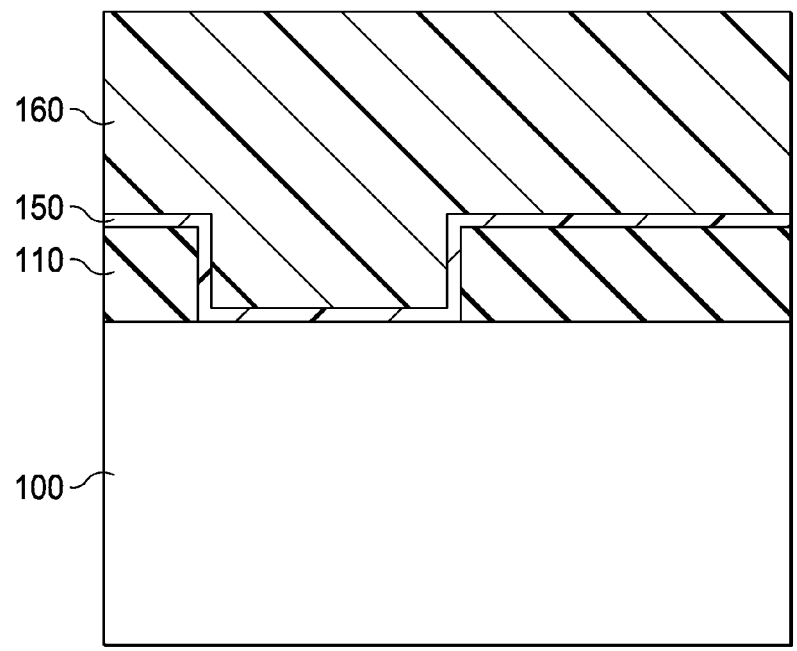

Referring to FIG. 7C, an etch stop layer 150 is deposited over the first insulating layer 110. In one or more embodiments, the first insulating layer 110 comprises a different material than the etch stop layer 150. In one or more embodiments, the etch stop layer 150 comprises a nitride, or silicon oxynitride. In alternative embodiments, the etch stop layer 150 may comprise titanium nitride, tantalum nitride, and/or tungsten nitride. The etch stop layer 150 may be deposited using a vapor deposition process such as chemical vapor deposition, plasma vapor deposition, as well as other types of deposition processes.

A hard mask layer 160 is deposited over the etch stop layer 150. The hard mask layer 160 may have a thickness of about 1000 nm to about 5000 nm in various embodiments. In one or more embodiments, the hard mask layer 160 may have a thickness of about 1000 nm to about 3000 nm. In one or more embodiments, the hard mask layer 160 may have a thickness of about 1500 nm to about 2000 nm. The hard mask layer 160 may comprise an inorganic dielectric layer such as a silicon oxide layer in various embodiments. In an alternative embodiment the hard mask layer 160 may comprise an imide layer.

The hard mask layer 160 may be a single layer or comprise multiple layers in various embodiments. The hard mask layer 160 protects the first insulating layer 110 during the subsequent through trench etch process. The material of the hard mask layer 160 may be selected based on the selectivity to the etch chemistry of the through trench etch process. For example, in one embodiment, a high density plasma with a fluorine chemistry may be subsequently used to etch the through substrate opening, and the hard mask layer 160 comprises a $SiO_2$ hard mask.

Figure 7D:
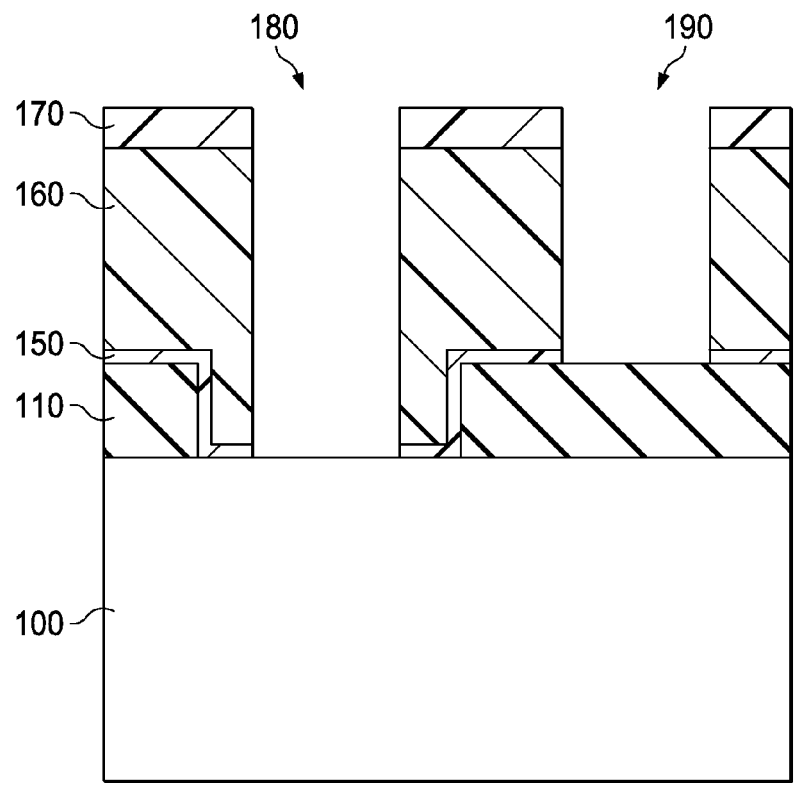

Referring to FIG. 7D, a first hard mask opening 180 and the second hard mask opening 190 are formed. The second resist layer 170 is deposited and patterned using conventional lithography techniques. Using the patterned second resist layer 170 as an etch mask, a first hard mask opening 180 and the second hard mask opening 190 are etched in the hard mask layer 160. The etching of the second hard mask opening 190 is stopped after reaching the etch stop layer 150, which is over the patterned first insulating layer 110. In contrast, the etching of the first hard mask opening 180 may continue upto the etch stop layer 150, which is adjacent the surface of the substrate 100.

The exposed etch stop layer 150 is removed exposing the substrate 100 in the first hard mask opening 180 and the first insulating layer 110 in the second hard mask opening 190.

Figure 7E:
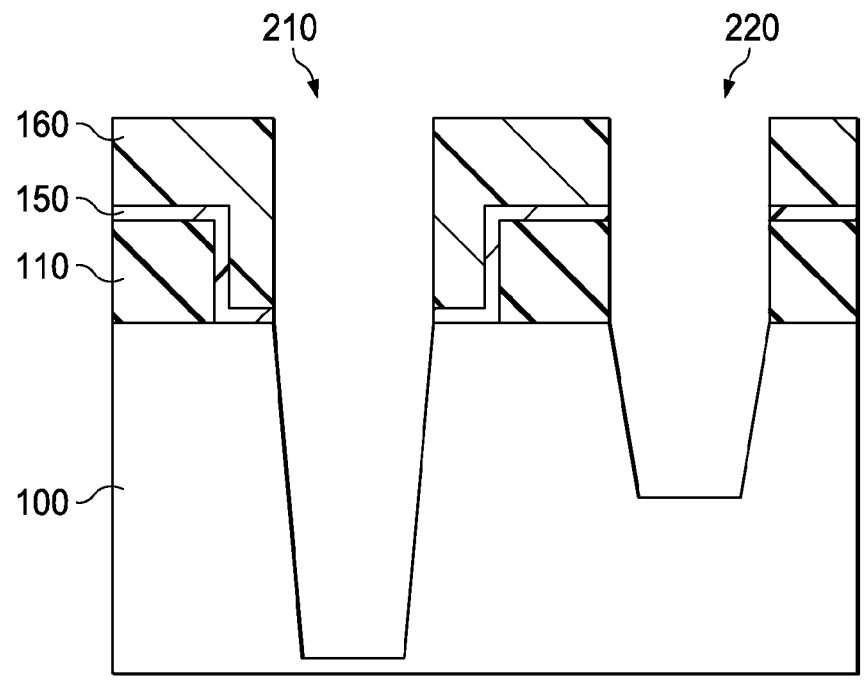

As next illustrated in FIG. 7E, using the first hard mask opening 180 and the second hard mask opening 190, the substrate 100 is etched to form a first opening 210 for a through via and a second opening 220 for the monitor structure.

The etching of the second opening 220 starts from the first insulating layer 110 while the etching of the first opening 210 starts from a top surface of the substrate 100. In various embodiments, the material of the first insulating layer 110 is selected so as to etch slower than the substrate 100. In other words, for a given material of the first insulating layer 110 and the substrate 100, a etch process is selected such that the etch rate of the first insulating layer 110 and the substrate 100 are different. Thus, the etching of the first insulating layer 110 is selected to be slower than the etching of the substrate 100.

In one embodiment, the etch selectivity between the first insulating layer 110 and the substrate 100 may be about 1:20 so that for every micron of first insulating layer 110 that is etched, at least 20 microns of substrate 10 are etched. In one or more embodiments, the etch selectivity between the first insulating layer 110 and the substrate 100 may be about 1:10 to about 1:30. In one or more embodiments, the etch selectivity between the first insulating layer 110 and the substrate 100 may be about 1:5 to about 1:20.

In various embodiments, the depth of the first opening 210 may be about 50 µm to about 100 µm. In one or more embodiments, the depth of the first opening 210 may be about 20 µm to about 200 µm. In one or more embodiments, the depth of the first opening 210 may be about 20 µm to about 80 µm. In various embodiments, the depth of the second opening 220 may be about 10 µm to about 30 µm. In various embodiments, the depth of the second opening 220 may be about 5 µm to about 50 µm. In various embodiments, the depth of the second opening 220 may be about 20 µm to about 30 µm.

In various embodiments, a ratio of the depth of the first opening 210 to the depth of the second opening 220 is about 3:1. In various embodiments, a ratio of the depth of the first opening 210 to the depth of the second opening 220 is about 2:1 to about 4:1. In various embodiments, a ratio of the depth of the first opening 210 to the depth of the second opening 220 is about 2:1 to about 10:1.

In various embodiments, the etching of the substrate 100 may be performed using a Bosch Process or by using a vertical reactive ion etch. In the Bosch process, etching and deposition are alternatively performed and may be repeated many times. In a first step, a plasma etch is used to vertically etch an opening while in a second step a passivation layer is deposited so as to prevent widening of the opening in regions already etched. The plasma etch is configured to etch vertically, e.g., using sulfur hexafluoride [SF6] in the plasma. The passivation layer is deposited, for example, using octa-fluorocyclobutane as a source gas. Each individual step may be turned on for a few seconds or less. The passivation layer protects the substrate 100 so as to prevent lateral etching. However, during the plasma etching phase, the directional ions that bombard the substrate 100 remove the passivation layer at the bottom of the opening being formed (but not along the sides) and etching continues. The Bosch process may produce sidewalls that are scalloped.

Figure 7F:
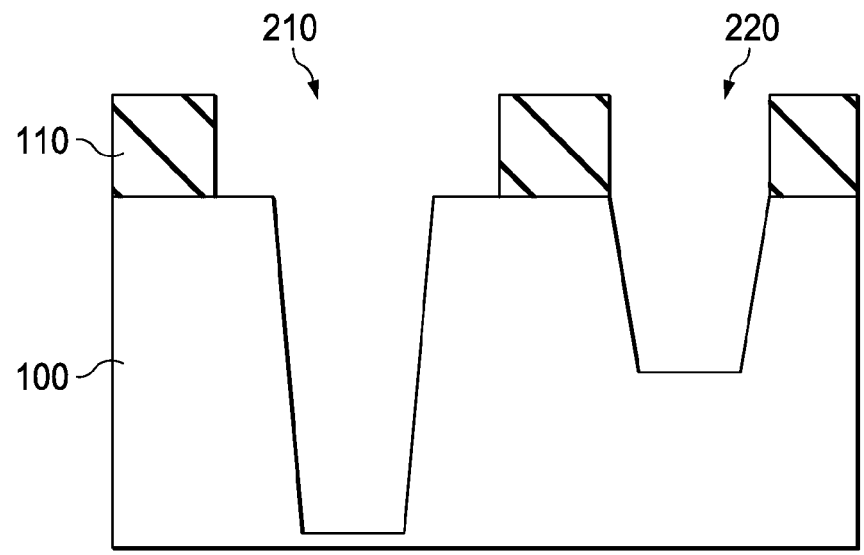

Referring to FIG. 7F, the remaining hard mask layer 160 and the etch stop layer 150 are removed. In various embodiments, the hard mask layer 160 and the etch stop layer 150 may be removed using an etching process such as wet etching.

Figure 7G:
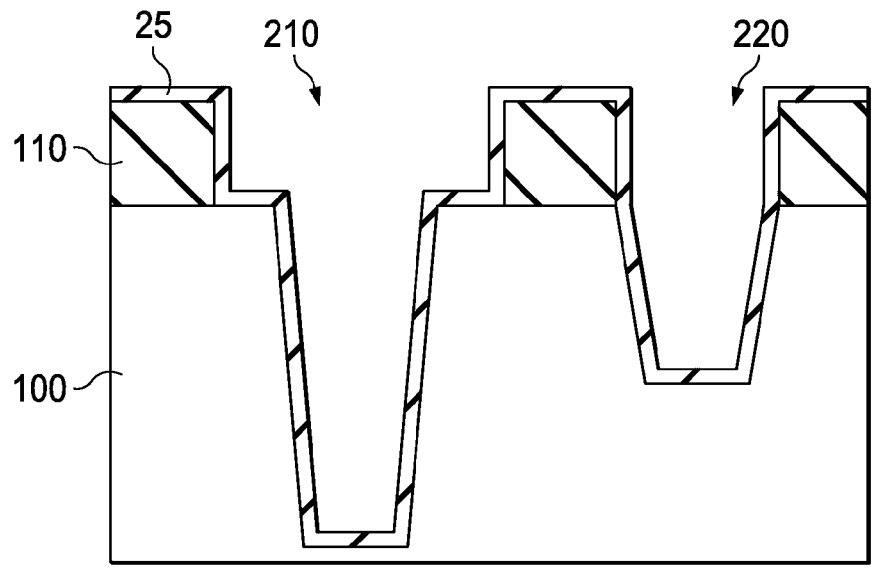

Referring to FIG. 7G, a liner 25 is formed over the first opening 210 and the second opening 220.

In various embodiments, the liner 25 is formed having a plurality of layers. In one or more embodiments, the liner 25 may comprise a dielectric layer, a barrier layer, and the seed layer. The barrier layer may be used to protect the underlying substrate 100 from the fill material 70 to be deposited within the first and the second openings 210 and 220. The dielectric layer and the seed layer are optional and may not be used in some embodiments.

In various embodiments, the liner 25 comprises layers of tantalum nitride and tantalum. In some embodiments, the liner 25 comprises tungsten and outer liners of titanium and titanium nitride or other metal liners or liner combinations. In one embodiment, the liner 25 comprises a TiW/Cu layer stack or Ti/Cu/Ni layer stack. In various embodiments, the liner 25 comprises Ti, TiN, Ta, TaN, Cu, Ni, Cr, Cr/Cu, Ni/V, Ti/Cu, TiW, Au, Ni/Au, Ni/Pd/Au, W, WN, WCN and combinations thereof. In various embodiments, the liner 25 may be deposited using sputter deposition, vapor deposition, printing, and other suitable techniques.

Referring to FIG. 7G, a fill material 70 is formed into the first opening 210 and the second opening 220.

In one or more embodiments, the fill material 70 comprises copper. In a different embodiment, the fill material 70 comprises tungsten. If the fill material 70 comprises tungsten, a bi-layer seed layer comprising CVD titanium nitride and silicon doped tungsten may be used. Similarly, in some embodiments, doped poly-silicon, silver, gold and/or aluminum may be deposited inside the first opening 210 to form the through substrate via 20.

The fill material 70 may be deposited using an electrochemical deposition process in one embodiment. In an alternate embodiment, the fill material 70 may be deposited using an electroless deposition process. In yet some embodiments, the fill material 70 may be deposited using other deposition processes such as vapor deposition, sputtering, etc.

In various embodiments, the fill material 70 partially fills the first opening 210. A partial fill is advantageous as it requires less deposition (electroplating) time and alleviates stress during subsequent processing.

However, the amount of fill, i.e., the first fill height FH1 of fill material 70 in the first opening 210 is difficult to monitor. In contrast, the second fill height FH2 of fill material 70 in the second opening 220 is easier to monitor. Thus, monitoring the rate of filling of the second opening 220 can help determine the rate of filling of the first opening 210. However, there may be some difference between the rate of filling of the first opening 210 and the rate of filling the second opening 220. This difference, however, may be determined periodically, for example, using test runs and may be therefore compensated.

In various embodiments, the second fill height FH2 of the fill material 70 in the second opening 220 may be monitored using mechanical contact measurement sensors. As an example, a stylus-based surface profiler may be used to measure step heights of the fill material 70 during the filling process. The stylus may be placed in contact with the fill material 70 and gently dragged along the surface of the fill material 70. The vertical deflection of the stylus may be used to measure the change in step height. In one embodiment, using such a tool, the step height Y2 of the top surface of the fill material 70 in the second opening 220 may be measured. In various embodiments, the fill material 70 in the second opening 220 may have a step height, i.e., may have a top surface that is not co-planar with a top surface of the substrate 100. In various embodiments, other types of measurements tools may be used.

Figure 7H:
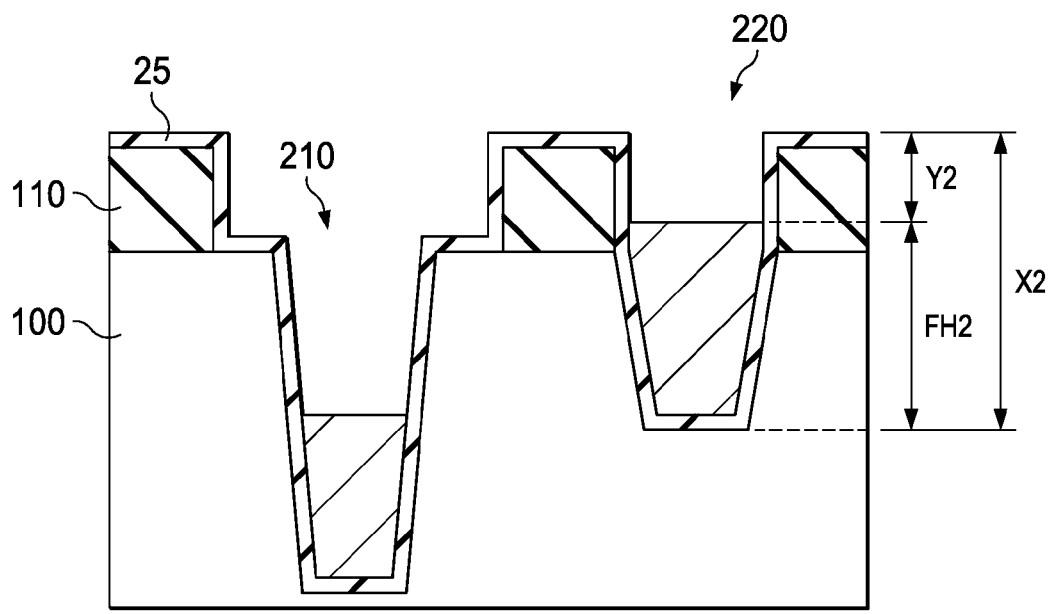

As illustrated in FIG. 7H, in one embodiment, the fill material 70 in the second opening 220 may have a negative step height so that the top surface of the fill material 70 in the second opening 220 is below the top surface of the adjacent liner 25 and/or the first insulating layer 110.

Next, in one embodiment, using another tool such as an ellipsometry, the depth of the second opening 220 X2 may be measured. The ellipsometry may be performed at an earlier process step in some embodiments. The difference between the depth of the second opening 220 X2 and the step height Y2 provides the second fill height H2.

In various embodiments, during the filling of the first opening 210 and the second opening 220, the second fill height FH2 may be monitored continuously (FIG. 8, boxes 310 and 320). If the second fill height FH2 is satisfactory, i.e., within a target range, then the fill process is completed. On the other hand, if the second fill height FH2 is lower than a target fill height, the deposition of the fill material 70 may be continued, e.g., for a longer time. In another case, if the second fill height FH2 is height than a target fill height, the deposition of the fill material 70 is immediately stopped. Further, this information may be fed into the process tool so that subsequent wafers in the lot may be processed by targeting a lower fill height, e.g., by reducing the deposition time (FIG. 8, box 330).

Figure 7I:
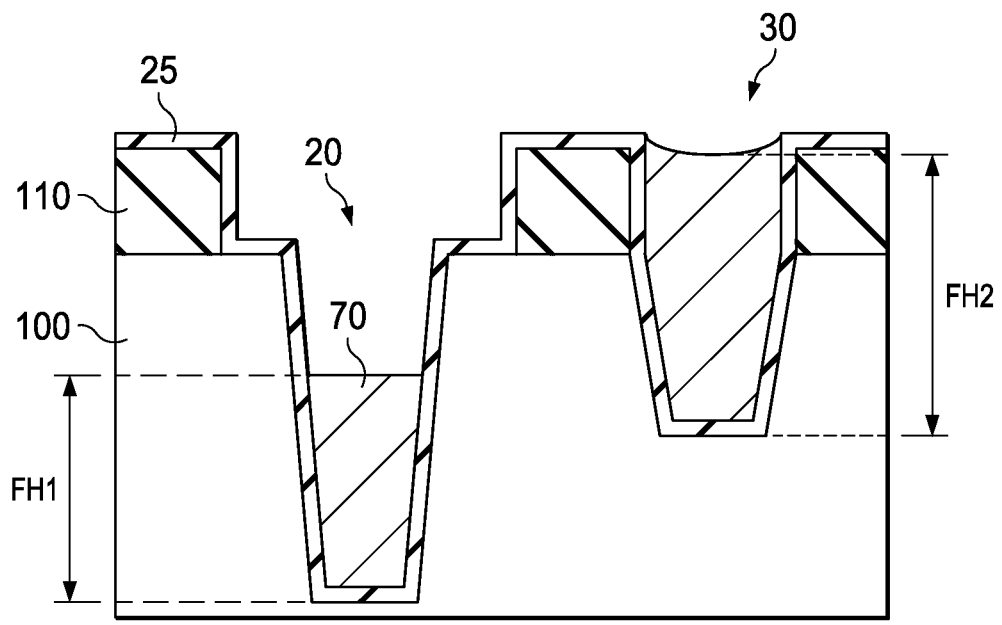

Referring next to FIG. 7I, the fill material 70 is thus formed from the first opening 210 and the second opening 220 so as to form a through via 20 and the monitor structure 30 respectively.

Thus, embodiments of the present invention enable in-line monitoring of the filling of the through vias 20. In various embodiments, subsequent processing may continue as in conventional semiconductor processing.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 7 may be combined with the embodiments described in FIGS. 1-6. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:

forming a first opening for a through via in a first workpiece and a second opening for a monitor structure, the first opening being deeper than the second opening;

depositing a fill material within the second opening up to a fill depth and within the first opening without overfilling the first opening with the fill material; and during the depositing, using an in-line measurement of the fill depth within the second opening, stopping the depositing of the fill material.

2. The method of claim 1, wherein the first opening is partially filled by the fill material after depositing the fill material within the first opening.

3. The method of claim 1, wherein the second opening is formed in the first workpiece.

4. The method of claim 3, wherein the fill material is deposited within the first opening and the second opening in a common process step, and wherein a deposition of the fill material within the first opening is stopped based on the measurement if a measured fill height in the second opening is higher than a target fill height or if the measured fill height is within a target range.

5. The method of claim 1, wherein the second opening is formed in a second workpiece.

6. The method of claim 1, wherein the first workpiece comprises a reconstituted wafer comprising a plurality of dies in an encapsulant, and wherein forming a first opening comprises forming the first opening in the encapsulant.

7. The method of claim 1, wherein the first workpiece comprises a semiconductor wafer, and wherein forming a first opening comprises forming the first opening in the semiconductor wafer.

8. A method of forming a semiconductor device, the method comprising:

forming a first opening for a through via in a first workpiece and a second opening for a monitor structure, the first opening being deeper than the second opening;

depositing a fill material within the first opening and the second opening;

measuring a fill depth of the fill material in the second opening;

using the measurement of the fill depth within the second opening, determining a termination point of the deposition of the fill material, wherein the first opening is partially filled after the termination of the deposition of the fill material.

9. The method of claim 8, wherein the first opening is partially filled by the fill material after depositing the fill material within the first opening.

10. The method of claim 8, wherein the second opening is formed in the first workpiece.

11. The method of claim 10, wherein the fill material is deposited within the first opening and the second opening in a common process step, and wherein a deposition of the fill material within the first opening is stopped based on the measurement.

12. The method of claim 8, wherein the second opening is formed in a second workpiece.

13. The method of claim 8, wherein the first workpiece comprises a reconstituted wafer comprising a plurality of dies in an encapsulant, and wherein forming a first opening comprises forming the first opening in the encapsulant.

14. The method of claim 8, wherein the first workpiece comprises a semiconductor wafer, and wherein forming a first opening comprises forming the first opening in the semiconductor wafer.

15. A method of forming a semiconductor device, the method comprising:

forming a first opening for a through via in a first workpiece and a second opening for a monitor structure, the first opening being deeper than the second opening;

filling a fill material within the first opening and the second opening;

during the filling, measuring a fill depth of the fill material in the second opening using a surface profiler; and stopping the filling if the measurement of the fill depth is higher than a target fill height and continuing the filling if the measurement of the fill depth is lower than the target fill height, wherein the first opening is partially filled after the stopping of the filling.

* * * * *